United States Patent
Jang et al.

(10) Patent No.: US 10,916,437 B2
(45) Date of Patent: Feb. 9, 2021

(54) METHODS OF FORMING MICROPATTERNS AND SUBSTRATE PROCESSING APPARATUS

(71) Applicant: Samsung Electronics Co., Ltd., Suwon-si (KR)

(72) Inventors: Sang-Shin Jang, Suwon-si (KR); Jong-Min Baek, Seoul (KR); Hoon-Seok Seo, Suwon-si (KR); Eui-Bok Lee, Seoul (KR); Sung-Jin Kang, Seoul (KR); Vietha Nguyen, Yongin-si (KR); Deok-Young Jung, Seoul (KR); Sang-Hoon Ahn, Hwaseong-si (KR); Hyeok-Sang Oh, Suwon-si (KR); Woo-Kyung You, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/233,399

(22) Filed: Dec. 27, 2018

(65) Prior Publication Data

US 2019/0198342 A1 Jun. 27, 2019

(30) Foreign Application Priority Data

Dec. 27, 2017 (KR) ........................ 10-2017-0181514

(51) Int. Cl.
*H01L 21/308* (2006.01)
*H01L 21/033* (2006.01)
(Continued)

(52) U.S. Cl.
CPC ........ *H01L 21/3086* (2013.01); *G03F 7/0752* (2013.01); *G03F 7/091* (2013.01); *G03F 7/11* (2013.01); *G03F 7/70033* (2013.01); *H01L 21/0228* (2013.01); *H01L 21/02274* (2013.01); *H01L 21/02304* (2013.01); *H01L 21/0332* (2013.01); *H01L 21/0337* (2013.01); *H01L 21/308* (2013.01); *H01L 21/3081* (2013.01); *H01L 21/3085* (2013.01); *H01L 21/3088* (2013.01); *H01J 37/32* (2013.01)

(58) Field of Classification Search
None
See application file for complete search history.

(56) References Cited

U.S. PATENT DOCUMENTS 7,488,683 B2 2/2009 Kobayashi et al.
7,670,945 B2 3/2010 Huang
(Continued)

FOREIGN PATENT DOCUMENTS

| JP | 2007-221165 A | 8/2007 |
|---|---|---|
| JP | 2011-151057 A | 8/2011 |
| KR | 10-2014-0106442 | 9/2014 |

*Primary Examiner* — Stephanie P Duclair
(74) *Attorney, Agent, or Firm* — Muir Patent Law, PLLC

(57) ABSTRACT

Provided herein is a method of forming micropatterns, including: forming an etching target film on a substrate; forming a photosensitivity assisting layer on the etching target film, the photosensitivity assisting layer being terminated with a hydrophilic group; forming an adhesive layer on the photosensitivity assisting layer, the adhesive layer forming a covalent bond with the hydrophilic group; forming a hydrophobic photoresist film on the adhesive layer; and patterning the photoresist film.

19 Claims, 16 Drawing Sheets

(51) Int. Cl.
*H01L 21/02* (2006.01)
*G03F 7/004* (2006.01)
*G03F 7/20* (2006.01)
*G03F 7/11* (2006.01)
*G03F 7/075* (2006.01)
*G03F 7/09* (2006.01)
*H01J 37/32* (2006.01)

(56) References Cited

U.S. PATENT DOCUMENTS

| | | |
|---|---|---|
| 8,178,439 B2 | 5/2012 | Tohnoe et al. |
| 8,202,783 B2 | 6/2012 | Lin et al. |
| 9,140,987 B2 * | 9/2015 | Chien ............... H01L 21/3086 |
| 9,196,523 B2 | 11/2015 | Lin |
| 9,234,276 B2 | 1/2016 | Varadarajan |
| 9,304,396 B2 | 4/2016 | Shamma et al. |
| 2009/0096106 A1 | 4/2009 | Vrtis et al. |
| 2014/0272709 A1 * | 9/2014 | Liu ..................... G03F 7/092 |
| | | 430/272.1 |
| 2016/0147152 A1 | 5/2016 | Fujitani et al. |
| 2016/0233083 A1 * | 8/2016 | Kim ................... H01L 21/0276 |

* cited by examiner

METHODS OF FORMING MICROPATTERNS AND SUBSTRATE PROCESSING APPARATUS

CROSS-REFERENCE TO RELATED APPLICATION

This application claims the benefit of Korean Patent Application No. 10-2017-0181514, filed on Dec. 27, 2017, in the Korean Intellectual Property Office, the disclosure of which is incorporated herein in its entirety by reference.

FIELD

The inventive concept relates to a method of forming micropatterns and a substrate processing apparatus, and more particularly, to a method of forming micropatterns whereby clear patterns may be obtained without pattern collapse and to a substrate processing apparatus.

BACKGROUND

Photolithography techniques using extreme ultraviolet rays have been developed to form micropatterns. Extreme ultraviolet rays exhibit a variety of different characteristics compared to commonly used light, and thus modification of detailed processes is required. In addition, photoresist patterns increasingly collapse as patterns are continuously miniaturized, and therefore, there is a need to develop a method of addressing this drawback.

SUMMARY

The inventive concept provides a method of forming micropatterns whereby clear patterns may be obtained without pattern collapse.

The inventive concept provides a substrate processing apparatus by which clear patterns may be obtained without pattern collapse.

According to an aspect of the inventive concept, there is provided a method of forming micropatterns, including: forming an etching target film on a substrate; forming a photosensitivity assisting layer terminated with a hydrophilic group; forming an adhesive layer on the photosensitivity assisting layer, the adhesive layer forming a covalent bond with the hydrophilic group; forming a photoresist film on the adhesive layer; and patterning the photoresist film.

According to another aspect of the inventive concept, there is provided a method of forming micropatterns, including: forming an etching target film on a substrate; forming a photosensitivity assisting layer on the etching target film; forming an adhesive layer on the photosensitivity assisting layer; forming a hydrophobic photoresist film on the adhesive layer; and patterning the photoresist film.

According to another aspect of the inventive concept, there is provided a substrate processing apparatus including: a first processing chamber configured to perform first processing on a substrate; a second processing chamber configured to perform second processing on the first processed substrate; and a transfer chamber configured to transfer the substrate in the first processing chamber to the second processing chamber.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
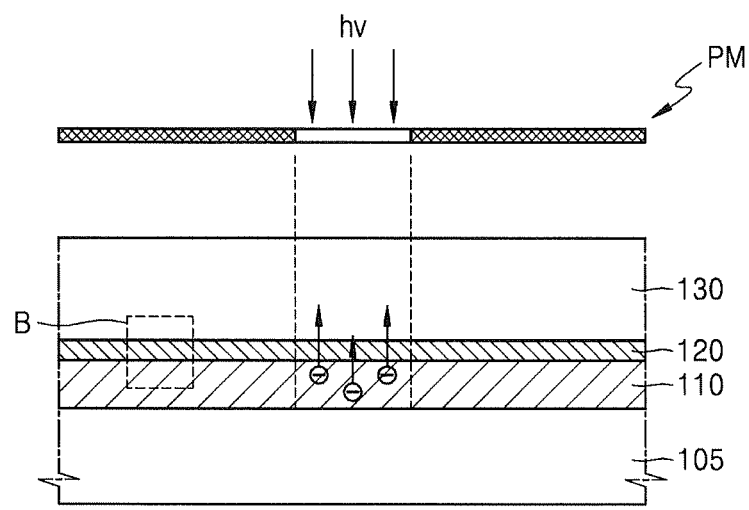
FIG. 1A is a conceptual view illustrating a principle of forming micropatterns, according to an embodiment of the inventive concept.

FIG. 1A is a concept view illustrating a principle of forming micropatterns, according to an embodiment of the inventive concept.

Referring to FIG. 1A, a photosensitivity assisting layer 110, an adhesive layer 120, and a photoresist film 130 may be sequentially provided on an etching target film 105.

The etching target film 105 is a material film to be patterned, and the type of material is not particularly limited. For example, the etching target film 105 may be a semiconductor material film, an insulating material film, a carbon-based material film, or a metal material film.

In some embodiments, the semiconductor material film may include silicon (Si), e.g., crystalline Si, polycrystalline Si, or amorphous Si. In some other embodiments, the semiconductor material film may include a semiconductor such as germanium (Ge), or a compound semiconductor such as silicon germanium (SiGe), silicon carbide (SiC), gallium arsenide (GaAs), indium arsenide (InAs), or indium phosphide (InP).

The insulating material film may be a silicon oxide ($SiO_x$) film, a silicon nitride (SiN) film, a silicon oxycarbonitride (SiOCN) film, a silicon carbonitride (SiCN) film, or a combination thereof. The silicon oxide may be a spin on dielectric (SOD) oxide, a high density plasma (HDP) oxide, a thermal oxide, borophosphosilicate glass (BPSG), phosphosilicate glass (PSG), borosilicate glass (BSG), polysilazane (PSZ), fluorinated silicate glass (FSG), low pressure tetraethylorthosilicate (LP-TEOS), plasma-enhanced tetraethylorthosilicate (PE-TEOS), tonen silazane (TOSZ), a flowable oxide (FOX), a high temperature oxide (HTO), a medium temperature oxide (MTO), undoped silicate glass (USG), spin on glass (SOG), an atomic layer deposition (ALD) oxide, a plasma-enhanced (PE) oxide, $O_3$-TEOS, or a combination thereof, but the inventive concept is not limited thereto.

The carbon-based material film may include an amorphous carbon layer (ACL) or a carbon-containing film formed of a spin-on hardmask (SOH) material. The carbon-containing film formed of the SOH material may be formed of an organic compound having a relatively high carbon content, i.e., about 85 wt % to about 99 wt % with respect to the total weight thereof. The organic compound may be an aromatic ring-containing a hydrocarbon compound or a derivative thereof.

The metal material film may include at least one metal selected from copper (Cu), titanium (Ti), tantalum (Ta), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd).

The photosensitivity assisting layer 110 may be a material layer formed of a material capable of emitting secondary electrons when irradiated with extreme ultraviolet (EUV) light, e.g., light having a wavelength of about 13.5 nm. As conceptually illustrated in FIG. 1A, when the photosensitivity assisting layer 110 is irradiated with EUV light, an irradiated region of the photosensitivity assisting layer 110 may release electrons excited by energy absorbed from the emitted EUV light to the photoresist film 130 positioned thereabove.

In some embodiments, the photosensitivity assisting layer 110 may include amorphous silicon (a-Si), tin oxide ($SnO_x$), titanium oxide ($TiO_x$), or silicon oxynitride (SiON).

The adhesive layer 120 may strengthen adhesion between the photosensitivity assisting layer 110 positioned therebelow and the photoresist film 130 positioned thereon. The adhesive layer 120 may have a thickness of about 2 Å to about 25 Å. When the thickness of the adhesive layer 120 is too small, the effect of strengthening adhesion between the photosensitivity assisting layer 110 and the photoresist film 130 may be insufficient. When the thickness of the adhesive layer 120 is too large, an auxiliary photosensitive effect of the photosensitivity assisting layer 110 may deteriorate. In other words, the secondary electrons released from the EUV light-irradiated region of the photosensitivity assisting layer 110 may not be transferred to the photoresist film 130.

Figure 1B:
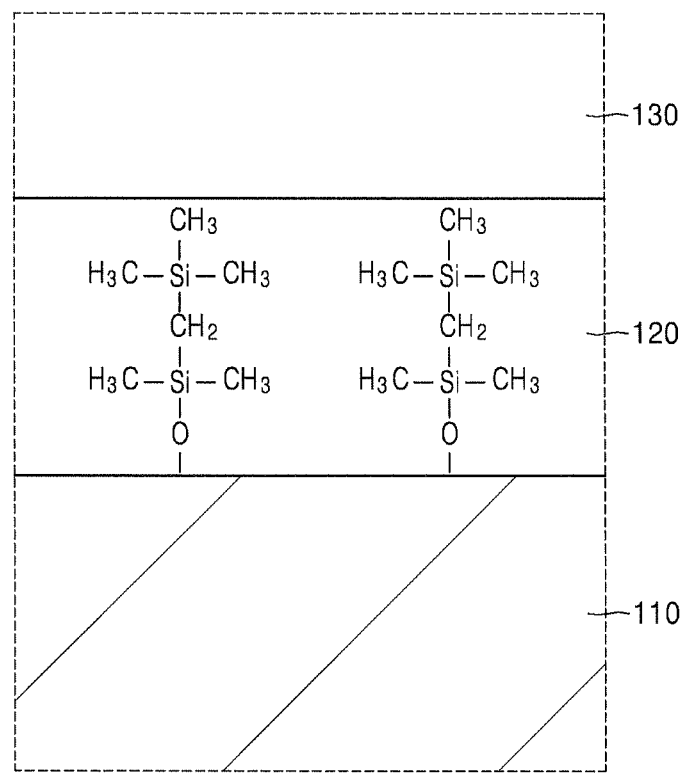
FIG. 1B is an enlarged view of portion B of FIG. 1A and a conceptual view illustrating the function of an adhesive layer, according to an embodiment of the inventive concept.

FIG. 1B is an enlarged view of portion B of FIG. 1A and a concept view illustrating the function of the adhesive layer 120, according to an embodiment of the inventive concept.

Referring to FIG. 1B, the adhesive layer 120 may form a covalent bond with the photosensitivity assisting layer 110. The adhesive layer 120 may be formed such that silane compounds and/or silazane compounds are bonded to each other, and an end of the bonded molecule may be bonded to the photosensitivity assisting layer 110.

For example, the adhesive layer 120 may be formed such that alkyl monosilanes or alkoxy monosilanes having a single silicon atom, alkyl disilanes or alkoxy disilanes having two or more silicon atoms, alkyl silazanes, and/or alkoxy disilazanes are bonded to each other into a chain, a branch, or a network type structure. Although FIG. 1B illustrates the adhesive layer 120 as having a chain-type bonding state, the inventive concept is not limited thereto.

An end of the adhesive layer 120 may form a covalent bond with the photosensitivity assisting layer 110 as described above. Meanwhile, another end of the adhesive layer 120 may be terminated with a $C_1$-$C_5$ alkyl group. The alkyl group may be hydrophobic, and when the photoresist film 130 is hydrophobic, the adhesion between the adhesive layer 120 and the photoresist film 130 may be relatively strong. The adhesive layer 120 and the photoresist film 130 may form covalent bonding therebetween, but may be bonded to each other by relatively strong van der Waals forces.

A surface (a lower surface of the adhesive layer 120 in FIG. 1A) of the adhesive layer 120 forms a covalent bond with the photosensitivity assisting layer 110 and another surface (an upper surface of the adhesive layer 120 in FIG. 1A) thereof forms a covalent bond or a relatively strong van der Waals bond with the photoresist film 130, and thus when the photoresist film 130 is patterned, pattern collapse may be effectively prevented.

In addition, since the thickness of the adhesive layer 120 is not thick, but is instead very small or thin, the adhesive layer 120 may not interfere with passing of the secondary electrons generated from the photosensitivity assisting layer 110 therethrough and transfer of the secondary electrons to the photoresist film 130.

Referring back to FIG. 1A, a portion of the photoresist film 130 which is exposed by light passing through a photomask PM may have properties that are changed while undergoing a chemical reaction. This aspect will be described below in more detail.

In addition to the light passing through the photomask PM, light incident on the photosensitivity assisting layer 110 after passing through the photoresist film 130 and the adhesive layer 120 may partially contribute to exposure of the photoresist film 130 to light, in the form of secondary electrons as described above. That is, light energy transmitted by light incident on the photosensitivity assisting layer 110 after passing through the photoresist film 130 and the adhesive layer 120 may excite electrons of the photosensitivity assisting layer 110 to be emitted to the photoresist film 130. The electrons (secondary electrons) may contribute to an acid-base reaction in the photoresist film 130, thereby contributing to exposure of the photoresist film 130 to light.

Figure 2:
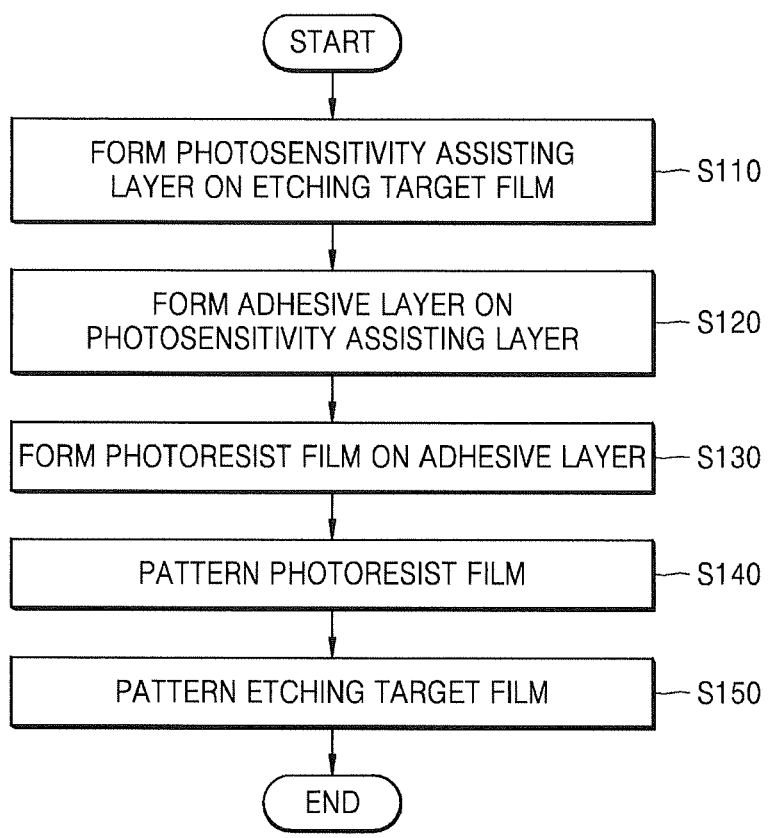
FIG. 2 is a flowchart illustrating a method of forming micropatterns, according to an embodiment of the inventive concept.

FIG. 2 is a flowchart illustrating a method of forming micropatterns, according to an embodiment of the inventive concept.

FIGS. 3A to 3H are cross-sectional views illustrating a method of forming micropatterns, according to an embodiment of the inventive concept.

Figure 3A:
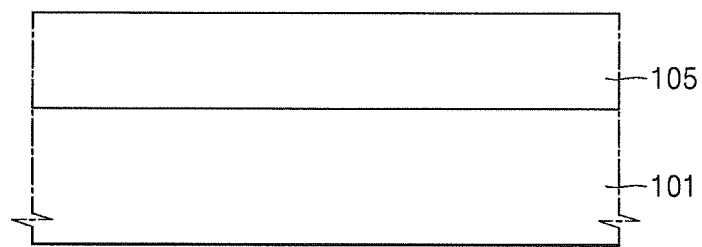
FIGS. 3A to 3H are cross-sectional views illustrating a method of forming micropatterns, according to an embodiment of the inventive concept.

Referring to FIGS. 2 and 3A, the etching target film 105 may be provided on the substrate 101.

The substrate 101 may include Si, for example, crystalline Si, polycrystalline Si, or amorphous Si. In some embodiments, the substrate 101 may include a semiconductor such as Ge, or a compound semiconductor such as silicon germanium (SiGe), silicon carbide (SiC), gallium arsenide (GaAs), indium arsenide (InAs), or indium phosphide (InP). In some embodiments, the substrate 101 may have a silicon-on-insulator (SOI) structure. For example, the substrate 101 may include a buried oxide (BOX) layer. In some embodiments, the substrate 101 may include a conductive region, for example, an impurity-doped well or an impurity-doped structure.

In addition, semiconductor devices such as transistors or diodes may be formed on the substrate 101. In addition, a plurality of wirings are arranged as a multi-layer on the substrate 101, and the wirings may be electrically separated from one another by an interlayer insulating layer.

The etching target film 105 may be a semiconductor material film, an insulating material film, a carbon-based material film, a metal material film, or a combination thereof. These material films have already been described above with reference to FIG. 1A, and thus detailed description thereof will be omitted herein.

The etching target film 105 may be formed using an appropriate method such as physical vapor deposition (PVD), chemical vapor deposition (CVD), atomic layer deposition (ALD), spin coating, or the like according to the type of material.

In some embodiments, the etching target film 105 and the substrate 101 may be integrally formed. In other words, an interface between the etching target film 105 and the substrate 101 may not be identifiable or may not exist.

Figure 3B:
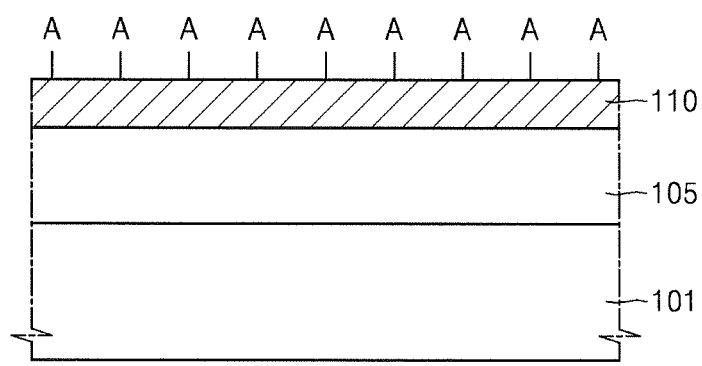

Referring to FIGS. 2 and 3B, the photosensitivity assisting layer 110 may be formed on the etching target film 105 (operation S110). A material of the photosensitivity assisting layer 110 has already been described above with reference to FIG. 1A, and thus detailed description thereof will be omitted herein.

The photosensitivity assisting layer 110 may be formed using a method such as PVD, CVD, or ALD. In some embodiments, the photosensitivity assisting layer 110 may be formed by plasma-enhanced CVD (PECVD), high density plasma CVD (HDP CVD), inductively coupled plasma CVD (ICP CVD), or capacitor coupled plasma CVD (CCP CVD). In some embodiments, the photosensitivity assisting layer 110 may be formed by PECVD.

The upper surface of the photosensitivity assisting layer 110 may be terminated with a hydrophilic group (-A). The hydrophilic group may be, for example, at least one of a hydroxyl group (—OH), a carboxyl group (—COOH), an amine group (—NH$_2$), a carbonyl group (—CO—), and a thiol group (—SH).

The hydrophilic group (-A) may be naturally occurring or may be attached through a surface treatment. The surface treatment may be a treatment in which the surface is brought into contact with a compound such as an alcohol, a carboxylic acid, an amine, an ether, a mercaptan, or the like. Methods of attaching the hydrophilic group (-A) in consideration of the material of the photosensitivity assisting layer 110 would be understood by those of ordinary skill in the art.

Figure 3C:
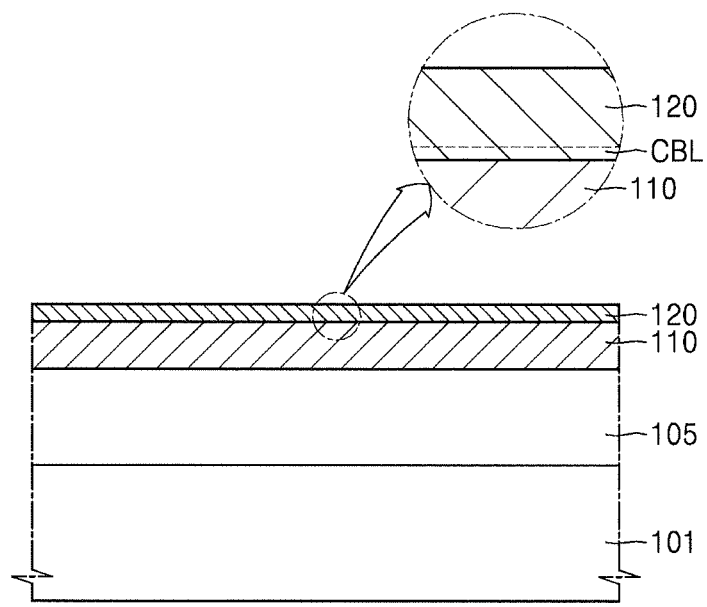

Referring to FIGS. 2 and 3C, the adhesive layer 120 is formed on the photosensitivity assisting layer 110 (operation S120).

As a source material for forming the adhesive layer 120, a silane compound and/or a silazane compound may be used.

The silane compound may be a monosilane or disilane compound. The silazane compound may be a monosilazane or disilazane compound. The silazane compound may also be referred to as an aminosilane compound.

The monosilane compound may have a structure represented by the formula $SiR^1R^2R^3R^4$. In the above formula, each of $R^1$, $R^2$, $R^3$, and $R^4$ may be independently hydrogen, $C_1$-$C_5$ alkyl group, a $C_1$-$C_5$ alkoxy group, a $C_2$-$C_5$ alkenyl group, a $C_2$-$C_5$ alkynyl group, or a $C_6$-$C_{10}$ aryl group. Here, all of $R^1$, $R^2$, $R^3$, and $R^4$ may not be hydrogen at the same time such that at least two thereof may be substituents other than hydrogen.

For example, the monosilane compound may be at least one selected from tetramethoxysilane, tetraethoxysilane, tetra-n-propoxysilane, tetraisopropoxysilane, tetra-n-butoxysilane, tetra-t-butoxysilane, dimethyldimethoxysilane, dimethyldiethoxysilane, diethyldimethoxysilane, methyltriethoxysilane, ethyltrimethoxysilane, tetramethylsilane, methoxytrimethylsilane, ethoxytrimethylsilane, iso-propoxytrimethylsilane, t-butoxytrimethylsilane, t-pentoxytrimethylsilane, methoxytriethylsilane, ethoxytriethylsilane, iso-propoxytriethylsilane, t-butoxytriethylsilane, t-pentoxytriethylsilane, methoxydimethylsilane, ethoxydimethylsilane, iso-propoxydimethylsilane, t-butoxydimethylsilane, t-pentoxydimethylsilane, dimethoxydimethylsilane, diethoxydimethylsilane, di-isopropoxydimethylsilane, di-t-butoxydimethylsilane, dimethoxydiethylsilane, diethoxydiethylsilane, di-isopropoxydiethylsilane, di-t-butoxydiethylsilane, dimethoxydi-isopropylsilane, diethoxydi-isopropylsilane, di-isopropoxydi-isopropylsilane, di-t-butoxydi-isopropylsilane, tetraethyl orthosilicate (Si(OCH$_2$CH$_3$)$_4$, TEOS), and mixtures thereof. However, the inventive concept is not limited to the above-listed examples.

In another embodiment, the monosilane compound may be at least one selected from vinyltrimethylsilane, phenoxytrimethylsilane, acetoxytrimethylsilane, phenoxytriethylsilane, acetoxytriethylsilane, phenoxydimethylsilane, acetoxydimethylsilane, methoxydimethylphenylsilane, ethoxydimethylphenylsilane, iso-propoxydimethylphenylsilane, t-butoxydimethylphenylsilane, t-pentoxydimethylphenylsilane, phenoxydimethylphenylsilane, acetoxydimethylphenylsilane, diacetoxydimethylsilane, diacetoxydiethylsilane, diacetoxydi-isopropylsilane, dimethoxymethylvinylsilane, diethoxymethylvinylsilane, di-isopropoxymethylvinylsilane, di-t-butoxymethylvinylsilane, diacetoxymethylvinylsilane, and mixtures thereof. However, the inventive concept is not limited to the above-listed examples.

The disilane compound may have a structure represented by the formula $R^5R^6R^7Si—SiR^8R^9R^{10}$. In the above formula, each of $R^5$, $R^6$, $R^7$, $R^8$, $R^9$, and $R^{10}$ may be independently selected from hydrogen, a hydroxyl group, a $C_1$-$C_5$ alkyl group, a $C_1$-$C_5$ alkoxy group, a $C_2$-$C_5$ alkenyl group, a $C_2$-$C_5$ alkynyl group, or a $C_6$-$C_{10}$ aryl group. Here, all of $R^5$, $R^6$, $R^7$, $R^8$, $R^9$, and $R^{10}$ may not be hydrogen at the same time such that at least one of $R^5$, $R^6$, and $R^7$ may be a substituent other than hydrogen and at least one of $R^8$, $R^9$, and $R^{10}$ may be a substituent other than hydrogen.

For example, the disilane compound may be at least one selected from monomethyldisilane, dimethyldisilane, 1,1,2,2-tetramethyldisilane, 1,1,1,2-tetramethyldisilane, 1,1,2,2-tetraethyldisilane, 1,1,1,2-tetraethyldisilane, trimethylmethoxysilane, dimethyldimethoxysilane, methyltrimethoxysilane, trimethylethoxysilane, dimethyldiethoxysilane, methyltriethoxysilane, pentamethyldisilane, hexamethyldisilane, hexamethyldisiloxane, hexaethyldisilane, hexapropyldisilane, hexapetyldisilane, 1,2-diphenyltetramethyldisilane, 1,1,2,2-tetraphenyldisilane, 1,2-dimethoxy-1,1,2,2-tetramethyldisilane, 1,2-diethoxy-1,1,2,2-tetramethyldisilane, 1,2-dimethyl-1,1,2,2-tetraphenyldisilane, tris(trimethylsilyl)silane, and mixtures thereof. However, the inventive concept is not limited to the above-listed examples.

The silazane compound (i.e., an aminosilane compound) may be, for example, at least one selected from bis(dimethylamino)dimethylsilane, bis(dimethylamino)methylvinylsilane, bis(ethylamino)dimethylsilane, diethylaminotrimethylsilane, dimethylaminodimethylsilane, tetrakismethylaminosilane, tris(dimethylamino)silane, bis(dimethylamino)silane (BDMAS)(SiH$_2$(NMe$_2$)$_2$), bis(diethylamino)silane (BDEAS)(SiH$_2$(NEt$_2$)$_2$), bis(tert-butylamino)silane (BTBAS)(SiH$_2$(NH($^t$Bu))$_2$), diethylaminotriethylsilane, dimethylaminotriethylsilane, ethylmethylaminotriethylsilane, t-butylaminotriethylsilane, isopropylaminotriethylsilane, di-isopropylaminotriethylsilane, diethylaminotrimethylsilane, dimethylaminotrimethylsilane, ethylmethylaminotrimethylsilane, t-butylaminotrimethylsilane, iso-propylaminotrimethylsilane, di-isopropylaminotrimethylsilane, diethylaminodimethylsilane, dimethylaminodimethylsilane, ethylmethylaminodimethylsilane, t-butylaminodimethylsilane, iso-propylaminodimethylsilane, di-isopropylaminodimethylsilane, diethylaminodiethylsilane, dimethylaminodiethylsilane, ethylmethylaminodiethylsilane, t-butylaminodiethylsilane, isopropylaminodiethylsilane, di-isopropylaminodiethylsilane, bis(diethylamino)dimethylsilane, bis(dimethylamino)dimethylsilane, bis(ethylmethylamino)dimethylsilane, bis(di-isopropylamino)dimethylsilane, bis(iso-propylamino)dimethylsilane, bis(tert-butylamino)dimethylsilane, bis(diethylamino)diethylsilane, bis(dimethylamino)diethylsilane, bis(ethylmethylamino)diethylsilane, bis(di-isopropylamino)diethylsilane, bis(iso-propylamino)diethylsilane, bis(tert-butylamino)diethylsilane, bis(diethylamino)methylvinylsilane, bis(dimethylamino)methylvinylsilane, bis(ethylmethylamino)methylvinylsilane, bis(di-isopropylamino)methylvinylsilane, bis(iso-propylamino)methylvinylsilane, bis(tert-butylamino)methylvinylsilane, tris(dimethylamino)phenylsilane, tris(dimethylamino)methylsilane, tris(dimethylamino)ethylsilane, 1,2-diethyl-tetrakis(diethylamino)disilane $((CH_2CH_3((CH_3CH_2)_2N)_2Si)_2)$, hexakis(N-pyrrolidino)disilane $(((C_4H_9N)_3)Si)_2)$, 1,2-dimethyltetrakis(diethylamino)disilane $((CH_3(CH_3CH_2N)_2Si)_2)$, hexakis(ethylamino)disilane $(((EtHN)_3Si)_2)$, and mixtures thereof. However, the inventive concept is not limited to the above-listed examples.

The adhesive layer 120 may be formed by PECVD, HDP CVD, ICP CVD, or CCP CVD. In some embodiments, the adhesive layer 120 may be formed by PECVD.

The adhesive layer 120 may be formed at a temperature ranging, for example, from about 250° C. to about 450° C. In some embodiments, the adhesive layer 120 may be formed at a temperature of about 310° C. to about 390° C. When the formation temperature of the adhesive layer 120 is too low, a reaction rate is low and thus productivity may be insufficient. When the formation temperature of the adhesive layer 120 is too high, a precursor material for forming the adhesive layer 120 may be thermally decomposed and side reactions may occur excessively.

In forming the adhesive layer 120, a substituent of the silane compound and/or the silazane compound may chemically react with the hydrophilic group (-A) to thereby form a covalent bond. As a result, a covalent bond layer (CBL) may be present at an interface between the adhesive layer 120 and the photosensitivity assisting layer 110.

When the hydrophilic group (-A) is a hydroxyl group (—OH) and a source material for forming the adhesive layer 120 is tetramethylsilane, the CBL may be formed by Reaction Scheme 1 below.

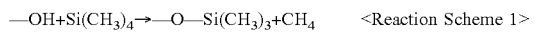
—OH+Si(CH$_3$)$_4$→—O—Si(CH$_3$)$_3$+CH$_4$    <Reaction Scheme 1>

Reaction Schemes 2 to 4 below show reactions through which CBLs are formed with respect to various hydrophilic groups (-A). However, the inventive concept is not limited by a particular theory.

NH$_2$+Si(CH$_3$)$_4$→—NH—Si(CH$_3$)$_3$+CH$_4$

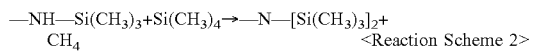
—NH—Si(CH$_3$)$_3$+Si(CH$_3$)$_4$→—N—[Si(CH$_3$)$_3$]$_2$+CH$_4$    <Reaction Scheme 2>

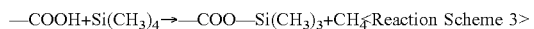
—COOH+Si(CH$_3$)$_4$→—COO—Si(CH$_3$)$_3$+CH$_4$    <Reaction Scheme 3>

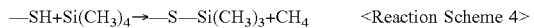
—SH+Si(CH$_3$)$_4$→—S—Si(CH$_3$)$_3$+CH$_4$    <Reaction Scheme 4>

Figure 3D:
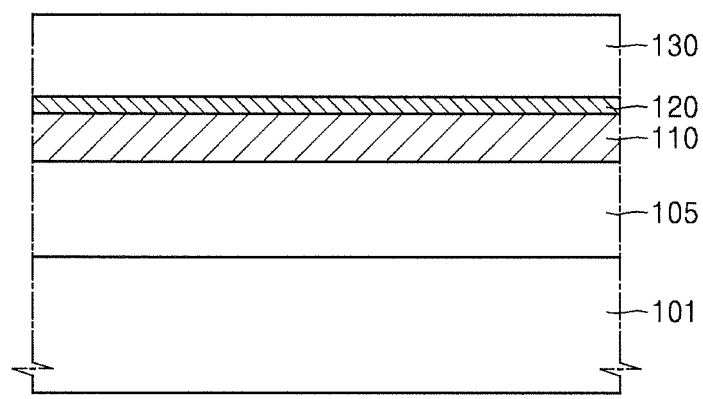

Referring to FIGS. 2 and 3D, the photoresist film 130 is formed on the adhesive layer 120 (operation S130). The photoresist film 130 may be a layer of a photosensitive resin.

In some embodiments, a positive-type photoresist may be used as the photosensitive resin. The positive-type photoresist may be a resist for EUV light (13.5 nm). The positive-type photoresist may be, for example, a (meth)acrylate-based polymer. The (meth)acrylate-based polymer may be, in particular, an aliphatic (meth)acrylate-based polymer, and may be, for example, polymethylmethacrylate (PMMA), poly(t-butylmethacrylate), poly(methacrylic acid), poly(norbornylmethacrylate), a copolymer or terpolymer of repeating units of the (meth)acrylate-based polymers, or a mixture thereof. In addition, these polymers may be substituted with various acid-labile protecting groups. The protecting groups may be tert-butoxycarbonyl (t-BOC), tetrahydropyranyl, trimethylsilyl, phenoxyethyl, cyclohexenyl, tert-butoxycarbonyl methyl, tert-butyl, adamantyl, norbornyl, or the like. However, the inventive concept is not limited to the above-listed examples.

In other some embodiments, a negative-type photoresist may be used as the photosensitive resin. The negative-type photoresist may be a phenol-aldehyde or formaldehyde based resin, e.g., a Novolac resin, may be any negative-type photoresist widely used in the photoresist art, and may be obtained, for example, by reacting a phenol compound with an aldehyde or ketone compound in the presence of an acidic catalyst.

The phenol compound may be phenol, orthocresol, metacresol, paracresol, 2,3-dimethylphenol, 3,4-dimethylphenol, 3,5-dimethylphenol, 2,4-dimethylphenol, 2,6-dimethylphenol, 2,3,6-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, isothymol, or the like. These materials may be used alone or a combination of two or more of these materials may be used.

The aldehyde compound may be formaldehyde, formalin, paraformaldehyde, trioxane, acetaldehyde, propylaldehyde, benzaldehyde, phenylacetaldehyde, a-phenylpropylaldehyde, B-phenylpropylaldehyde, O-hydroxybenzaldehyde, m-hydroxybenzaldehyde, p-hydroxybenzaldehyde, O-chlorobenzaldehyde, m-chlorobenzaldehyde, p-chlorobenzaldehyde, O-methylbenzaldehyde, m-methylbenzaldehyde, p-methylbenzaldehyde, p-ethylbenzaldehyde, p-n-butylbenzaldehyde, terephthalic acid aldehyde, or the like. These materials may be used alone or a combination of two or more of these materials may be used.

The ketone compound may be acetone, methylethylketone, diethylketone, or diphenylketone. These materials may be used alone or a combination of two or more of these materials may be used.

The photosensitive resin may have a weight average molecular weight of about 1,000 to about 500,000 when measured by gel permeation chromatography using polystyrene as a standard. The amount of the photosensitive resin may range from about 1 wt % to about 60 wt % with respect to the total photoresist material.

The photoresist film 130 may be formed using a method such as spin coating.

Figure 3E:
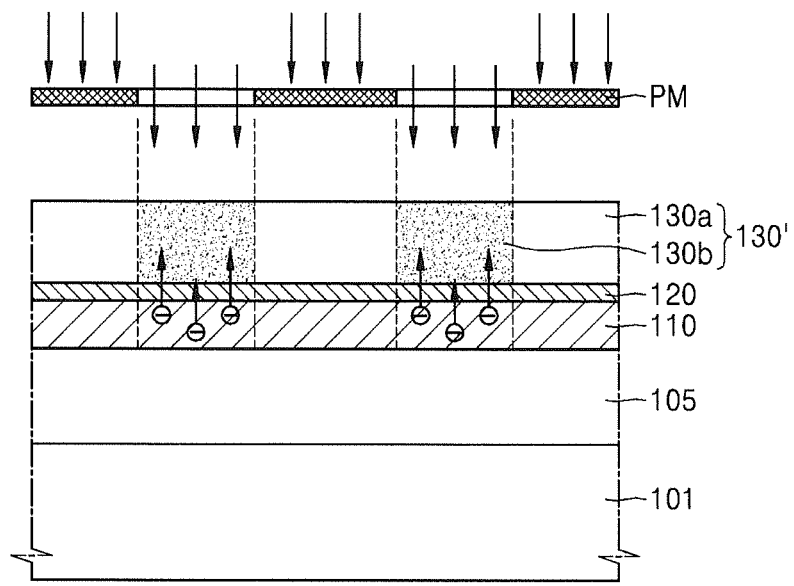

Referring to FIGS. 2 and 3E, the photoresist film 130 is exposed to EUV light by using a photomask PM. The EUV light may be, for example, light having a wavelength of about 13.5 nm.

Light passing through the photomask PM may convert the photoresist film 130 to an exposed photoresist film 130'. The exposed photoresist film 130' may include an exposed portion 130b and a non-exposed portion 130a. In the exposed portion 130b, a chemical reaction may occur in response to the emitted light. The chemical reaction may be an acid-base reaction or detachment of a predetermined functional group.

A part of the radiated light may be transmitted to the photosensitivity assisting layer 110 by passing through the exposed photoresist film 130'. Due to this, the light-irradiated portion of the photosensitivity assisting layer 110 may absorb energy. The absorbed energy may excite electrons of the light-irradiated portion, and at least a part of the excited electrons (secondary electrons) may be emitted to the outside of the photosensitivity assisting layer 110, i.e., towards the exposed portion 130b. As such, the secondary electrons emitted to the exposed portion 130b further accelerates the chemical reaction in the exposed portion 130b, and thus enable clearer patterning with regard to the non-exposed portion 130a.

Figure 3F:
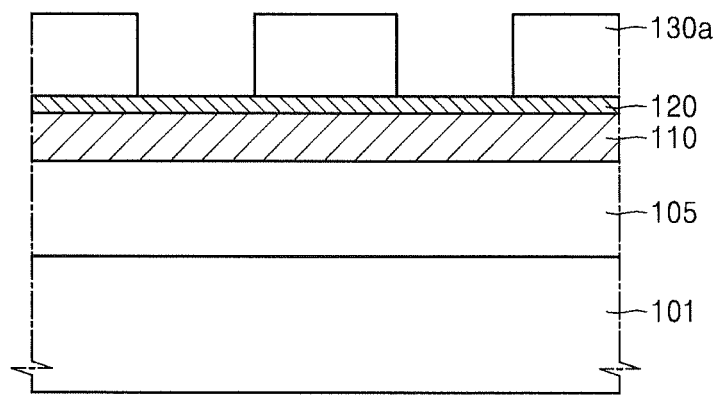

Referring to FIGS. 2 and 3F, the photoresist film 130 may be patterned by developing the exposed portion 130b to be removed (operation S140).

Examples of developing agents for developing the exposed portion 130b include aromatic hydrocarbons such as benzene, toluene, and xylene; cyclohexane or cyclohexanone; non-cyclic or cyclic ethers such as dimethyl ether, diethyl ether, ethylene glycol, propylene glycol, hexylene glycol, ethylene glycol monomethyl ether, ethylene glycol monoethyl ether, ethylene glycol methyl ethyl ether, diethylene glycol monomethyl ether, diethylene glycol monoethyl ether, diethylene glycol dimethyl ether, propylene glycol methyl ether, propylene glycol ethyl ether, propylene glycol propyl ether, propylene glycol butyl ether, tetrahydrofuran, and dioxane; acetates such as methyl acetate, ethyl acetate, propyl acetate, butyl acetate, methyl hydroxy acetate, ethyl hydroxy acetate, propyl hydroxy acetate, butyl hydroxy acetate, methylmethoxy acetate, ethylmethoxy acetate, propylmethoxy acetate, butylmethoxy acetate, methylethoxy acetate, ethylethoxy acetate, propylethoxy acetate, butylethoxy acetate, methylpropoxy acetate, ethylpropoxy acetate, propylpropoxy acetate, butylpropoxy acetate, methylbutoxy acetate, ethylbutoxy acetate, propylbutoxy acetate, butylbutoxy acetate, propylene glycol methyl ether acetate, propylene glycol ethyl ether acetate, propylene glycol propyl ether acetate, propylene glycol butyl ether acetate, methyl cellosolve acetate, and ethyl cellosolve acetate; propionates such as methyl 3-hydroxy propionate, ethyl 3-hydroxy propionate, propyl 3-hydroxy propionate, butyl 3-hydroxy propionate, methyl 2-methoxy propionate, ethyl 2-methoxy propionate, propyl 2-methoxy propionate, butyl 2-methoxy propionate, methyl 2-ethoxy-propionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, propylene glycol methyl ether propionate, propylene glycol ethyl ether propionate, propylene glycol propyl ether propionate, and propylene glycol butyl ether propionate; butyrates such as oxyisobutyric acid ester (e.g., methyl-2-hydroxyisobutyrate), methyl α-methoxyisobutyrate, ethyl methoxyisobutyrate, methyl α-ethoxyisobutyrate, ethyl α-ethoxyisobutyrate, methyl β-methoxyisobutyrate, ethyl β-methoxyisobutyrate, methyl β-ethoxyisobutyrate, ethyl β-ethoxyisobutyrate, methyl β-isopropoxyisobutyrate, ethyl β-isopropoxyisobutyrate, isopropyl β-isopropoxyisobutyrate, butyl β-isopropoxyisobutyrate, methyl β-butoxyisobutyrate, ethyl β-butoxyisobutyrate, butyl β-butoxyisobutyrate, methyl α-hydroxyisobutyrate, ethyl α-hydroxyisobutyrate, isopropyl α-hydroxyisobutyrate, and butyl α-hydroxyisobutyrate; lactates such as methyl lactate, ethyl lactate, propyl lactate, and butyl lactate; and combinations thereof. However, the inventive concept is not limited to the above-listed examples.

Figure 3G:
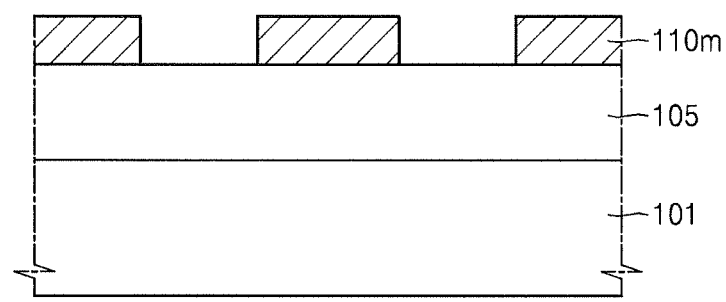

Referring to FIGS. 2 and 3G, the adhesive layer 120 and the photosensitivity assisting layer 110 may be patterned using a photoresist pattern consisting of the non-exposed portion 130a as an etching mask.

Patterning of the adhesive layer 120 and the photosensitivity assisting layer 110 may be performed by anisotropic etching, and the anisotropic etching may be performed, for example, by plasma etching using an etching gas including a $C_xF_yH_z$-containing gas where x and y are each independently an integer of 1 to 10, and z is an integer of 0 to 10. The $C_xF_yH_z$-containing gas may be a gas containing carbon (C) and fluorine (F), or a gas containing C, F, and hydrogen (H). For example, the $C_xF_yH_z$-containing gas may be $CF_4$, $C_3F_6$, $C_4F_6$, $C_4F_8$, $C_5F_8$, $CH_3F$, $CHF_3$, $CH_2F_2$, or a combination thereof. In some embodiments, the etching gas may further include an inert gas such as argon (Ar).

More particularly, exposed portions of the adhesive layer 120 and the photosensitivity assisting layer 110 may be removed by anisotropic etching by applying plasma while supplying an etching chamber with a mixed gas of $CH_3F$ and $O_2$ in a volume ratio of about 2:1 by using Ar gas.

For the anisotropic etching, reactive ion etching (RIE) equipment, magnetically enhanced reactive ion etching (MERIE) equipment, inductively coupled plasma (ICP) equipment, transformer coupled plasma (TCP) equipment, hollow anode type plasma equipment, helical resonator plasma equipment, electron cyclotron resonance (ECR) equipment, or the like may be used.

A photosensitivity assisting layer pattern 110m is formed by the anisotropic etching. In some embodiments, an adhesive layer pattern may partially remain on the photosensitivity assisting layer pattern 110m. In other some embodiments, the adhesive layer 120 may be substantially completely removed by the anisotropic etching.

Figure 3H:
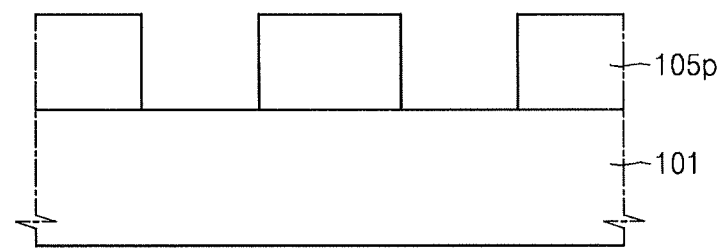

Referring to FIGS. 2 and 3H, a patterned etching target film 105p may be obtained by etching the etching target film 105 using the photosensitivity assisting layer pattern 110m as an etching mask (operation S150). The photosensitivity assisting layer pattern 110m used as an etching mask may be removed.

When the method of forming micropatterns according to embodiments of the inventive concept is used, ultra micropatterns may be easily formed without pattern collapse. In addition, since secondary electrons are used in addition to directly emitted light, a lesser quantity of light may be used and clear patterns may be obtained.

Figure 4:
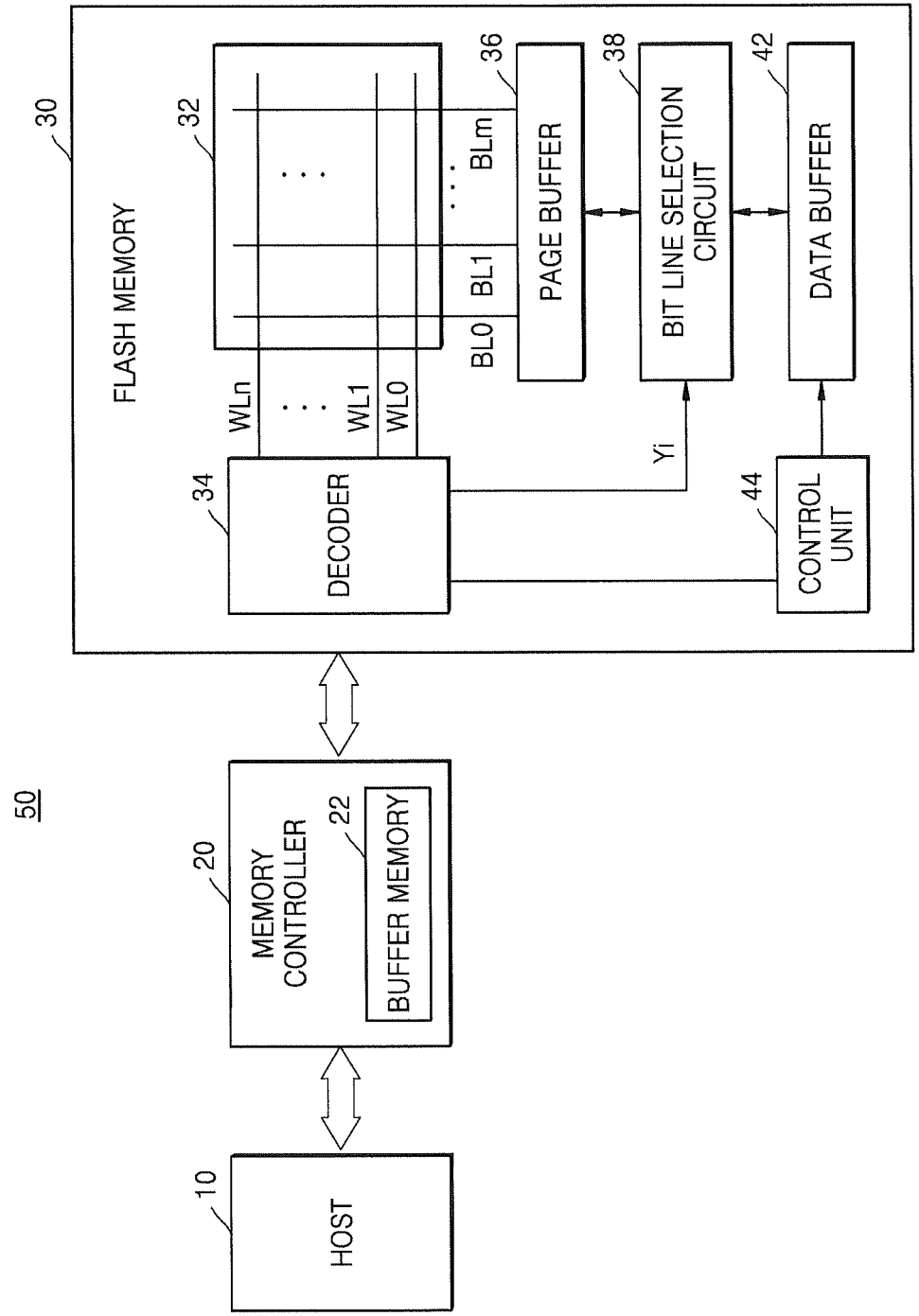
FIG. 4 is a schematic block diagram illustrating a memory system of an example semiconductor device that may be embodied using a method of forming micropatterns according to the inventive concept.

FIG. 4 is a schematic block diagram illustrating a memory system 50 of an example semiconductor device that may be embodied using a method of forming micropatterns according to the inventive concept.

Referring to FIG. 4, the memory system 50 of a semiconductor device may include a host 10, a memory controller 20, and a flash memory 30.

The memory controller 20 acts as an interface between the host 10 and the flash memory 30, and may include a buffer memory 22. Although not shown in the drawing, the memory controller 20 may further include a central processing unit (CPU), a read only memory (ROM), a random access memory (RAM), and interface blocks.

The flash memory 30 may further include a cell array 32, a decoder 34, a page buffer 36, a bit line selection circuit 38, a data buffer 42, and a control unit 44.

Data and a write command are input from the host 10 to the memory controller 20, and the memory controller 20 controls the flash memory 30 to write data to the cell array 32 according to the input command. In addition, the memory controller 20 controls the flash memory 30 to read the data stored in the cell array 32 according to a read command input from the host 10. The buffer memory 22 temporarily stores data that is transmitted between the host 10 and the flash memory 30.

The cell array 32 of the flash memory 30 includes a plurality of memory cells. The decoder 34 is connected to the cell array 32 via word lines WL0, WL1, ..., WLn. The decoder 34 receives an address from the memory controller 20 to select one of the word lines WL0, WL1, ..., WLn or to generate a selection signal Yi so as to select one of a plurality of bit lines BL0, BL1, ..., BLm. The page buffer 36 is connected to the cell array 32 via the bit lines BL0, BL1, ..., BLm.

Figure 5:
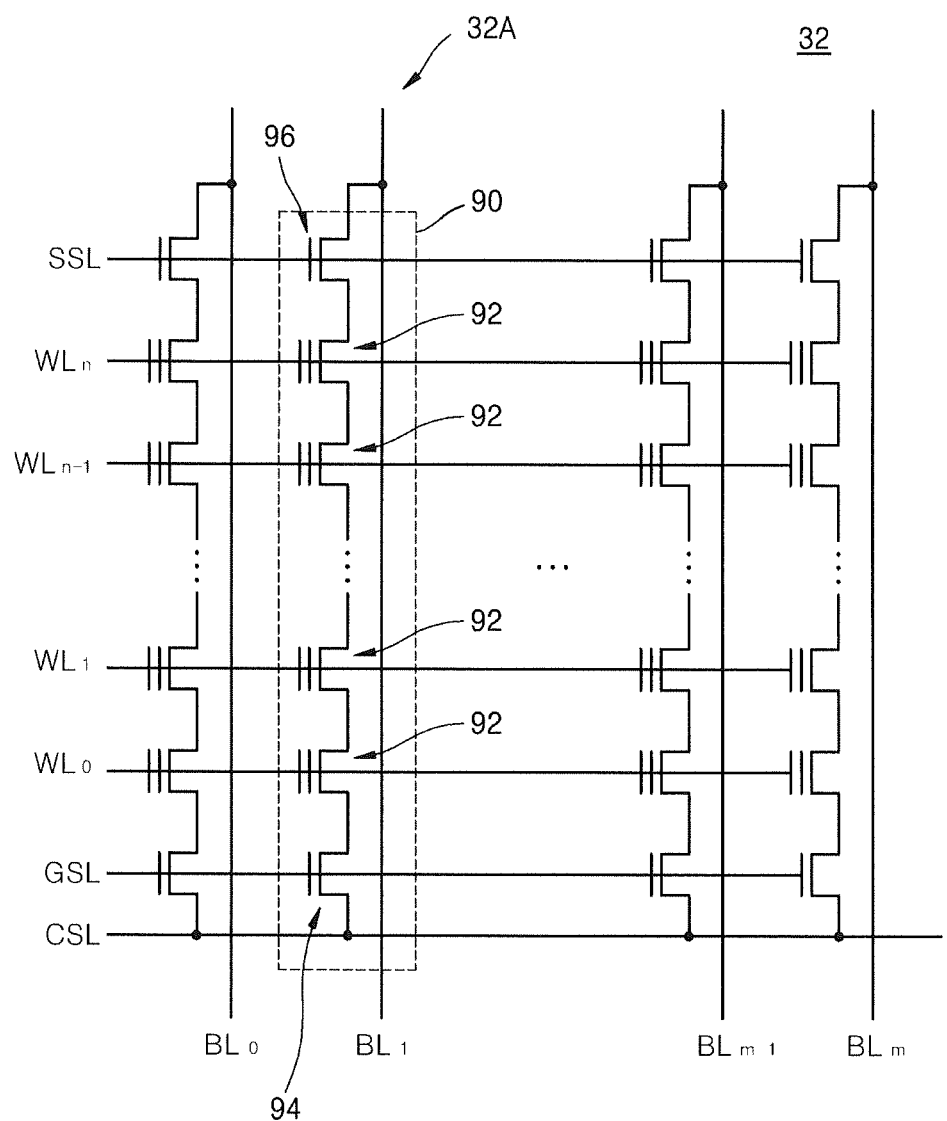
FIG. 5 is a circuit diagram for explaining an example structure of a cell array.

FIG. 5 is a circuit diagram for explaining an example structure of the cell array 32. Referring to FIG. 5, the cell array 32 may include a plurality of memory cell blocks 32A each including a plurality of memory cells, and each memory cell block 32A includes a plurality of cell strings 90 each arranged between the bit lines BL0, BL1, ..., BLm and a common source line CSL. Each cell string 90 includes a plurality of memory cells 92 connected in series. Gate electrodes of the plurality of memory cells 92 included in each cell string 90 are respectively connected to different word lines WL0, WL1, ..., WLn. A ground selection transistor 94 connected to a ground selection line GSL and a string selection transistor 96 connected to a string selection line SSL are respectively arranged at opposite ends of the cell string 90. The ground selection transistor 94 and the string selection transistor 96 control electrical connection between the plurality of memory cells 92 and the bit lines BL0, BL1, ..., BLm and the common source line CSL. The memory cells, which are connected to one of the word lines WL0, WL1, ..., WLn across the cell strings 90, form a page unit or a byte unit.

In a general NAND flash memory device, at the word lines WL0, WL1, ..., WLn, contact pads are connected to each other in an integrated from to connect the word lines WL0, WL1, ..., WLn to the decoder 34. The contact pads connected to the respective word lines need to be formed at the same time with the word lines WL0, WL1, ..., WLn. In addition, in the case of the NAND flash memory device, low density patterns having a relatively wider width, such as the ground selection line GSL, the string selection line SSL, and transistors for peripheral circuits, need to be formed at the same time when forming the word lines WL0, WL1, ..., WLn, which have a relatively narrower width.

Figure 6:
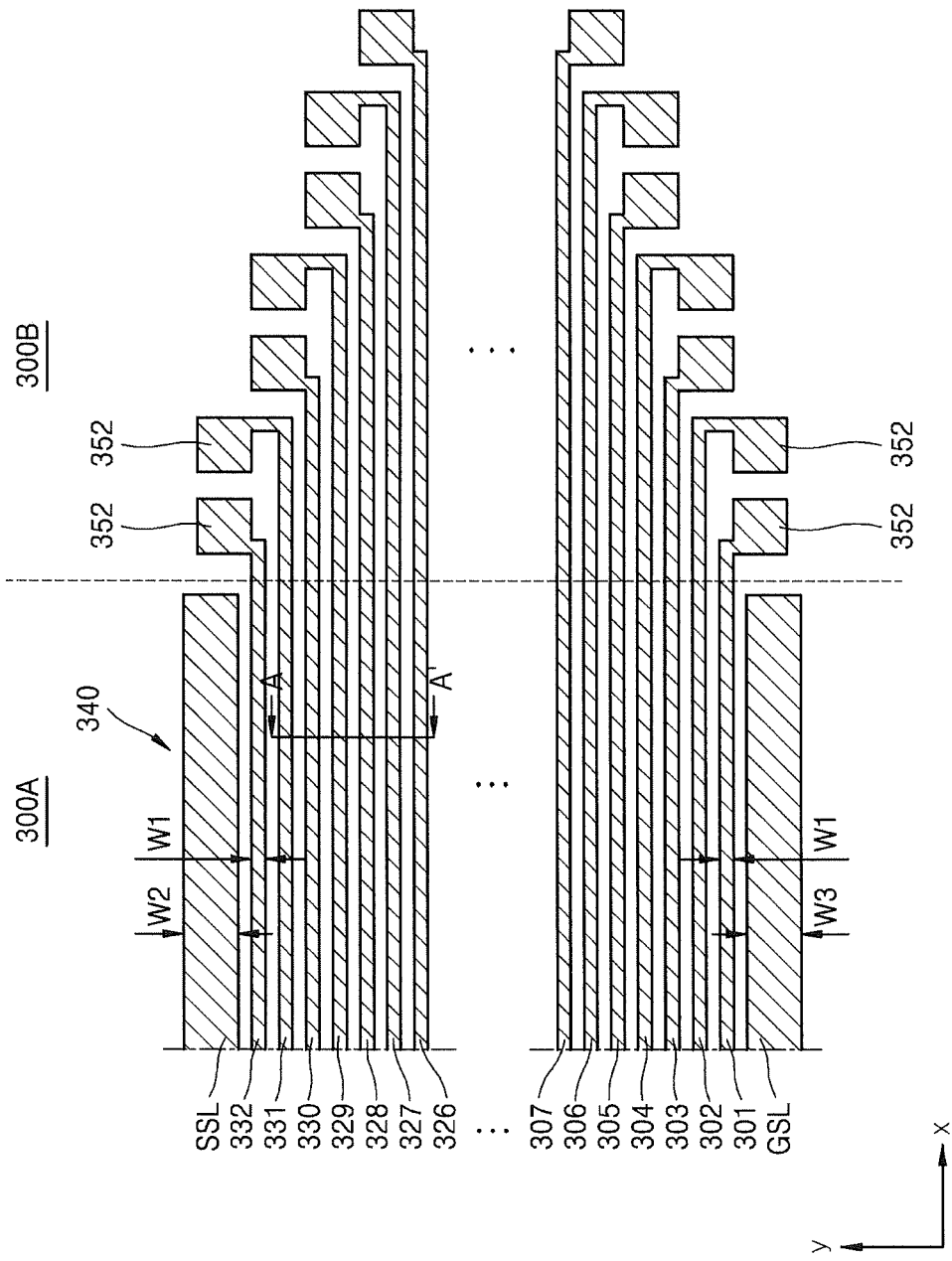
FIG. 6 is a partial plan view illustrating a structure of a semiconductor device that may be embodied according to a method of forming micropatterns according to the inventive concept.

FIG. 6 is a partial plan view illustrating a structure of a semiconductor device that may be embodied using a method of forming micropatterns of a semiconductor device according to the inventive concept. FIG. 6 illustrates a layout of a portion of a memory cell area 300A of a NAND flash memory device and a portion of a connection area 300B configured to connect a plurality of conductive lines constituting cell arrays of the memory cell area 300A, such as word lines or bit lines, to an external circuit (not shown) such as a decoder.

Referring to FIG. 6, a plurality of memory cell blocks 340 are formed in the memory cell area 300A. In FIG. 6, only one memory cell block 340 is illustrated. In the memory cell block 340, a plurality of conductive lines 301, 302, ..., 332 required to constitute one cell string 90 (see FIG. 5) between the string selection line SSL and the ground selection line GSL extend in parallel to one another in a first direction (x-direction in FIG. 5). The plurality of conductive lines 301, 302, ..., 332 extend over the memory cell area 300A and the connection area 300B.

To connect the plurality of conductive lines 301, 302, ..., 332 to the external circuit such as a decoder, a plurality of contact pads 352 are respectively formed at ends of the plurality of conductive lines 301, 302, ..., 332 in an integrated form with the plurality of conductive lines 301, 302, ..., 332.

In FIG. 6, the plurality of conductive lines 301, 302, ..., 332, the string selection line SSL, the ground selection line GSL, and the contact pads 352 may be formed of the same material. Each of the plurality of conductive lines 301, 302, ..., 332 may be a word line constituting a plurality of memory cells in the memory cell area 300A. The string selection line SSL and the ground selection line GSL may have greater widths W2 and W3, respectively than a width W1 of the plurality of conductive lines 301, 302, ..., 332.

In another embodiment, the plurality of conductive lines 301, 302, ..., 332 may be bit lines constituting memory cells in the memory cell area 300A. In this case, the string selection line SSL and the ground selection line GSL may be omitted.

Although FIG. 6 illustrates that 32 conductive lines, i.e., the plurality of conductive lines 301, 302, ..., 332, are included in one memory cell block 340, one memory cell block 340 may include various numbers of conductive lines within the scope of the inventive concept.

Hereinafter, a method of forming micropatterns of a semiconductor device, according to an embodiment of the inventive concept, will be described in detail.

FIGS. 7A to 7F are cross-sectional views sequentially illustrating a method of forming micropatterns of a semiconductor device, according to an embodiment of the inventive concept. The cross-sectional views may correspond to views taken along a line AA' of FIG. 6.

Figure 7A:
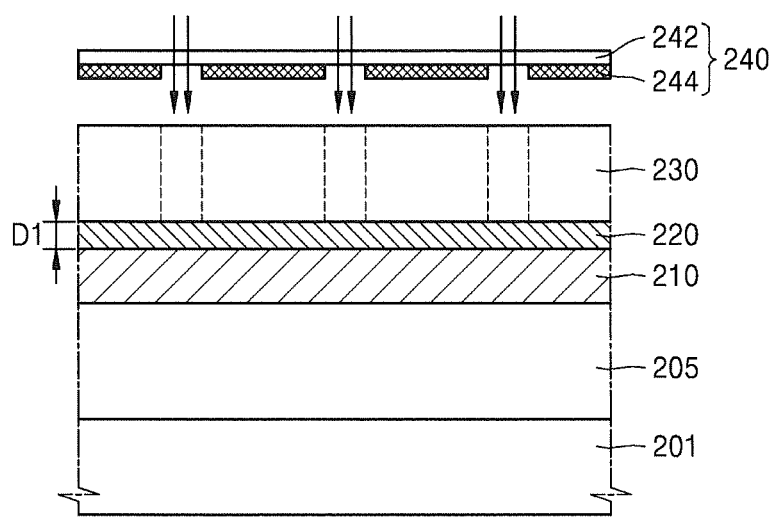
FIGS. 7A to 7F are cross-sectional views sequentially illustrating a method of forming micropatterns of a semiconductor device, according to an embodiment of the inventive concept.

Referring to FIG. 7A, an etching target film 205, a photosensitivity assisting layer 210, an adhesive layer 220, and a photoresist film 230 are sequentially stacked on a substrate 201, and light exposure for forming patterns is performed using an exposure mask 240. Light emitted for the light exposure may EUV light, for example, light having a wavelength of about 13.5 nm.

The substrate 201, the etching target film 205, the photosensitivity assisting layer 210, the adhesive layer 220, and the photoresist film 230 have already been described in detail with reference to FIGS. 1A to 3H, and thus detailed description thereof will be omitted herein.

In some embodiments, the photoresist film 230 may be formed by a wet method such as spin coating. In some embodiments, the photosensitivity assisting layer 210 and the adhesive layer 220 may be formed by vapor deposition such as chemical vapor deposition.

The adhesive layer 220 may have a thickness of about 2 Å to about 25 Å. In particular, a distance D1 between the photoresist film 230 and the photosensitivity assisting layer 210 may be less than 50 Å. When the distance D1 between the photoresist film 230 and the photosensitivity assisting layer 210 is too great due to an excessively large thickness of the adhesive layer 220, or the like, secondary electrons generated from the photosensitivity assisting layer 210 may not be transferred to the photoresist film 230.

Herein, a case in which the photoresist film 230 is a negative photoresist has been described, but it is understood by those of ordinary skill in the art that the inventive concept can also be applied to a case in which the photoresist film 230 is a positive photoresist.

In some embodiments, the photoresist film 230 may have a thickness of about 20 nm to about 50 nm. In some embodiments, the thickness of the photoresist film 230 may range from about 22 nm to about 44 nm. In some embodiments, the thickness of the photoresist film 230 may range from about 25 nm to about 39 nm. When the thickness of the photoresist film 230 is too large, emitted EUV light may not be transmitted to a lower portion of the photoresist film 230. When the thickness of the photoresist film 230 is too small, the photoresist film 230 may not act as an etching mask.

In some embodiments, a material film that acts as an anti-reflection film may not be present between the adhesive layer 220 and the photoresist film 230. In some embodiments, a material film that acts as an anti-reflection film may not be present between the adhesive layer 220 and the photosensitivity assisting layer 210.

The exposure mask 240 may include, for example, a light shielding film 244 that is appropriately designed to have a line-and-space image on a quartz substrate 242. The light shielding film 244 may be formed of, for example, chromium.

Figure 7B:
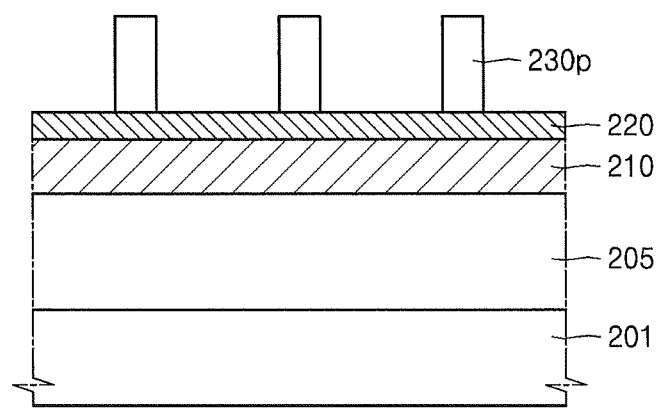

Referring to FIG. 7B, the photoresist film 230 may be developed to obtain a photoresist pattern 230p. As described above, since the photoresist film 230 of FIG. 7A is a negative photoresist, a non-exposed portion may be removed by developing and an exposed portion may remain.

Figure 7C:
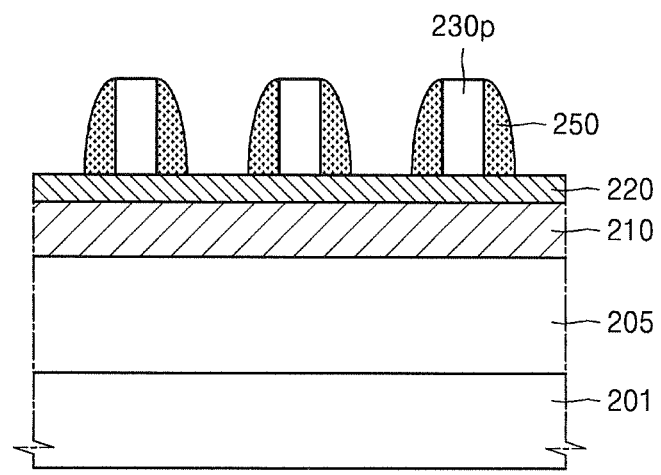

Referring to FIG. 7C, a spacer 250 may be arranged on opposite sides of the photoresist pattern 230p.

The spacer 250 may be a material having sufficient etching selectivity with the photoresist pattern 230p, for example, a spin-on-oxide (SOX) material.

A layer of the SOX material may be conformally arranged, cured, and then etched back to expose an upper surface of the photoresist pattern 230p, thereby obtaining the spacer 250.

Figure 7D:
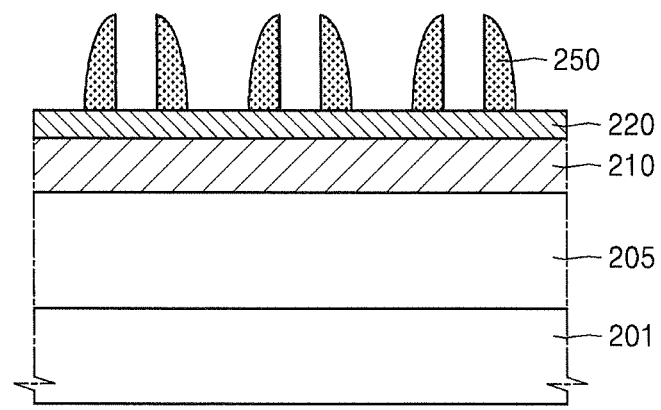

Referring to FIG. 7D, the photoresist pattern 230p may be removed. The photoresist pattern 230p may be removed using a developing agent. A basic aqueous solution may be used as the developing agent, for example, an aqueous tetramethyl ammonium hydroxide (TMAH) solution. The aqueous TMAH solution may have a concentration of, for example, about 2 wt % to about 5 wt %.

Figure 7E:
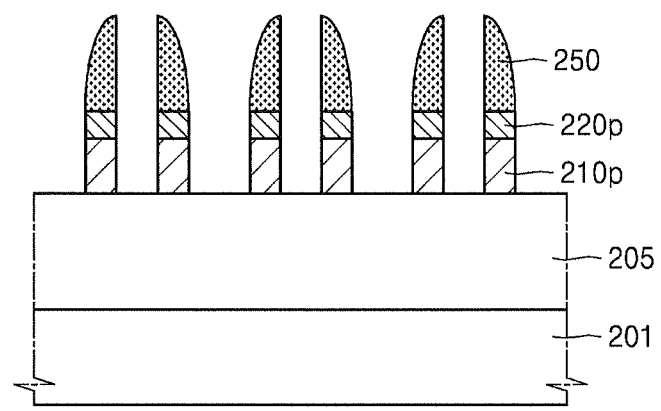

Referring to FIG. 7E, the adhesive layer 220 and the photosensitivity assisting layer 210 may be etched using the spacer 250 as an etching mask. Through this, an adhesive layer pattern 220p and a photosensitivity assisting layer pattern 210p to which a pattern of the spacer 250 is transferred may be obtained.

Figure 7F:
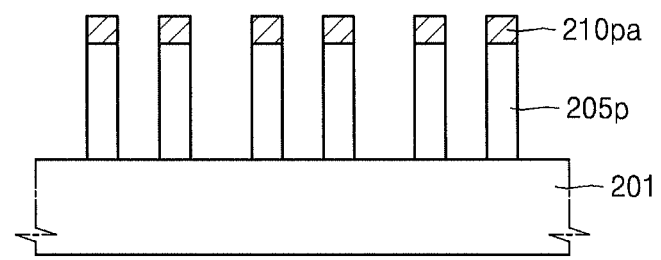

Referring to FIG. 7F, the etching target film 205 may be etched using the photosensitivity assisting layer pattern 210p as an etching mask. Through this, an etching pattern 205p to which the photosensitivity assisting layer pattern 210p is transferred may be obtained. A photosensitivity assisting layer pattern 210pa may have a slightly decreased height by the etching compared to that in FIG. 7E.

When comparing FIG. 7B with FIG. 7F, it can be seen that a pattern density of the line-and-space pattern is doubled. To form the conductive lines 301, 302, . . . , 332 as illustrated in FIG. 4 by using the method of forming micropatterns as described above, a hard mask material film may be formed on a conductive material and then the above-described method may be performed to form a hard mask, and then the conductive material may be etched using the hard mask, thereby forming the conductive lines 301, 302, . . . , 332.

Figure 8A:
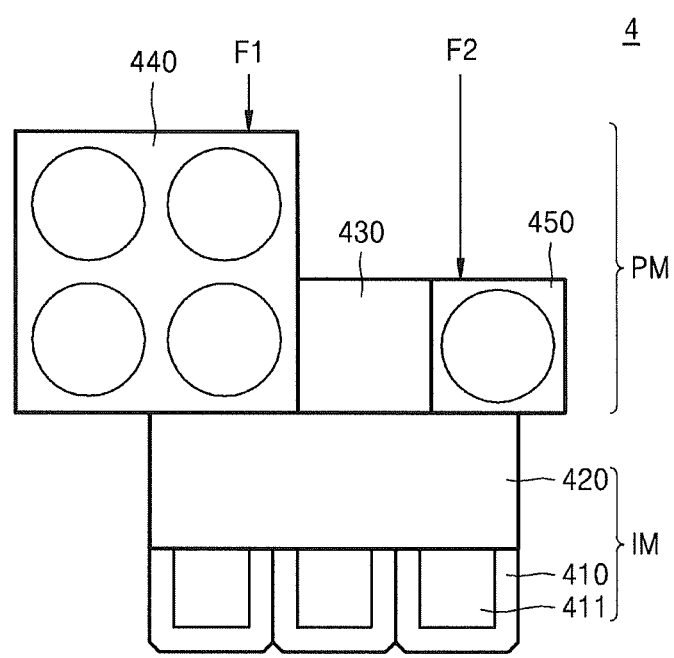
FIGS. 8A and 8B are plan views illustrating substrate processing apparatuses according to embodiments of the inventive concept.
Figure 8B:
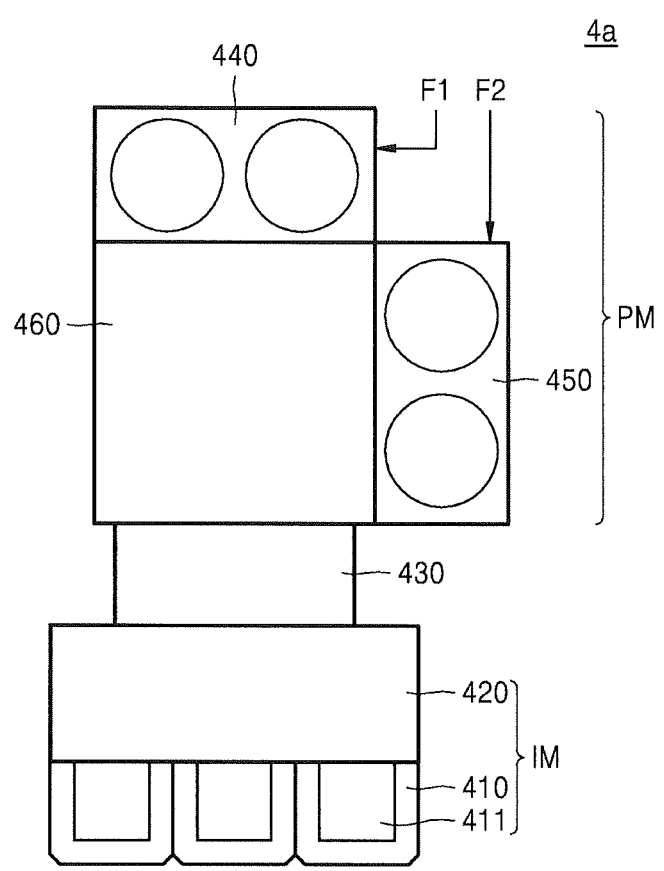

FIGS. 8A and 8B are plan views illustrating substrate processing apparatuses 4 and 4a according to embodiments of the inventive concept.

Referring to FIG. 8A, the substrate processing apparatus 4 may include an index module IM and a substrate processing module PM.

The index module IM may include a load port 410 and a transfer frame 420. A carrier 411 that accommodates a substrate therein may be seated in the load port 410. As the carrier 411, a front opening unified pod (FOUP) may be used. The load port 410 may be provided in plural. The number of load ports 410 may be increased or decreased according to processing efficiency, footprint conditions, and the like of the substrate processing module PM. The carrier 411 may be provided with a plurality of slots to accommodate substrates in a state of being positioned in parallel to the ground.

The substrate processing module PM may include a load lock chamber 430, a first processing chamber 440, and a second processing chamber 450. Types and positions of the load lock chamber 430, the first processing chamber 440, and the second processing chamber 450 may vary according to need.

The first processing chamber 440 and the second processing chamber 450 may be chambers that perform processes different from each other. For example, the first processing chamber 440 may perform a process of forming a first material film on the transferred substrate, and the second processing chamber 450 may perform a process of forming a second material film on the transferred substrate.

In some embodiments, a first material film may be formed on a substrate in the first processing chamber 440, and then a second material film may be formed on the substrate in the second processing chamber 450. For example, the first material film may be the photosensitivity assisting layer 110 described with reference to FIGS. 1A to 3H, and the second material film may be the adhesive layer 120.

In some embodiments, each of the first processing and the second processing may be chemical vapor deposition using plasma treatment.

A plurality of substrates may be simultaneously processed in the first processing chamber 440. In addition, a plurality of substrates may be simultaneously processed in the first processing chamber 440 while positions thereof are sequentially changed. For example, four sheets of substrates may be simultaneously processed on four stations in the first processing chamber 440.

A supply line F1 of a first source material for forming the first material film may be connected to the first processing chamber 440. A supply line F2 of a second source material for forming the second material film may be connected to the second processing chamber 450. The first source material and the second source material may be different from each other.

Referring to FIG. 8B, in the substrate processing apparatus 4a, a buffer unit 460 may be connected to the load lock chamber 430, and each of the first processing chamber 440 and the second processing chamber 450 may be connected to the buffer unit 460.

The buffer unit 460 provides a space that allows a substrate to stay before the substrate is transferred between the first and second processing chambers 440 and 450 and the carrier 411. The transfer frame 420 may be configured to transfer substrates between the carrier 411 seated in the load port 410 and the load lock chamber 430.

Each of the substrate processing apparatuses 4 and 4a of FIGS. 8A and 8B, respectively, includes both a chamber configured to form a first material film by PECVD (the first processing chamber 440) and a chamber configured to form a second material film by PECVD (the second processing chamber 450), and may be configured such that the first material film and the second material film are sequentially stacked while substrates are sequentially transferred therebetween.

The first material film may include amorphous silicon (a-Si), tin oxide ($SnO_x$), titanium oxide ($TiO_x$), or silicon oxynitride (SiON).

The second material film may include a layer of a material in which silane compounds and/or silazane compounds are mutually bonded.

Figure 9:
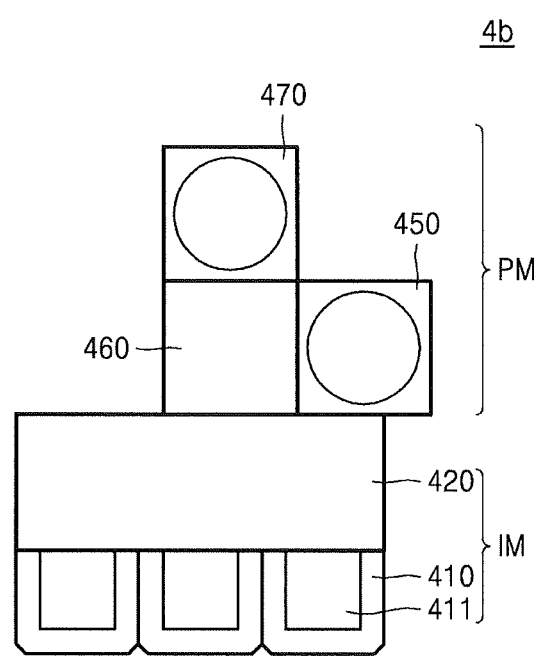
FIG. 9 is a plan view illustrating a substrate processing apparatus according to another embodiment of the inventive concept.

FIG. 9 is a plan view illustrating a substrate processing apparatus 4b according to another embodiment of the inventive concept.

Referring to FIG. 9, the substrate processing apparatus 4b may include an index module IM and a substrate processing module PM. The index module IM is the same as described above with reference to FIGS. 8A and 8B, and thus detailed description thereof will be omitted herein.

The substrate processing module PM may include the buffer unit 460, and the second processing chamber 450 and a third processing chamber 470 that are connected to the buffer unit 460.

The buffer unit 460 and the second processing chamber 450 are the same as described above with reference to FIGS. 8A and 8B, and thus detailed description thereof will be omitted herein.

A substrate introduced to the second processing chamber 450 may be transferred to the third processing chamber 470 after forming the second material film on a surface of the substrate. A third material film may be formed on the second material film of the substrate in the third processing chamber 470. The third material film may be formed using a wet method such as spin coating.

In some embodiments, the second processing chamber 450 may be deposition equipment of a material film, and the third processing chamber 470 may be spin coating equipment. In some embodiments, the second material film may be the adhesive layer 120 described above with reference to FIGS. 1A to 3H. In some embodiments, the third material film may be the photoresist film 130 described above with reference to FIGS. 1A to 3H.

Figure 10:
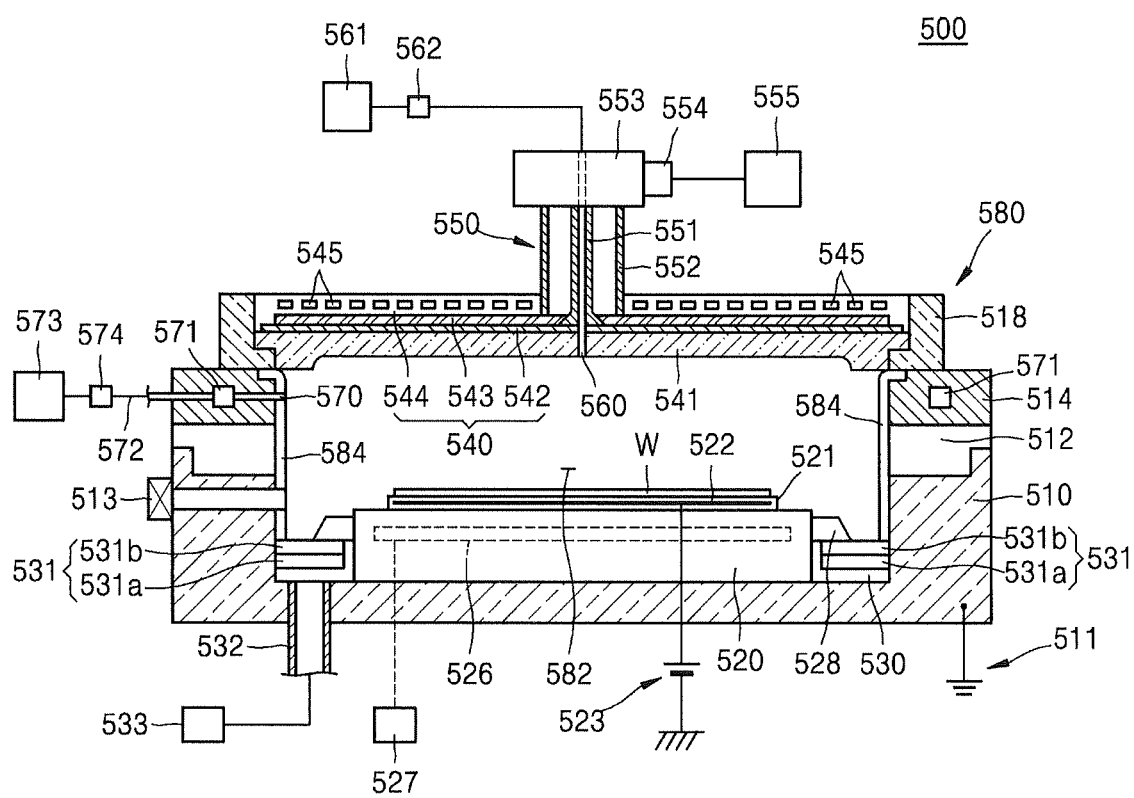
FIG. 10 is a side cross-sectional view illustrating a hydrogen plasma chemical vapor deposition apparatus as an example of a plasma deposition apparatus.

Hereinafter, a plasma deposition apparatus that may be applied to FIGS. 8A, 8B, and 9 will be described in more detail. FIG. 10 is a side cross-sectional view illustrating a hydrogen plasma chemical vapor deposition apparatus 500 as an example of the plasma deposition apparatus.

Referring to FIG. 10, the hydrogen plasma chemical vapor deposition apparatus 500 includes a lower chamber 510. A lower gas ring 512, an upper gas ring 514, and a dome plate 518 may be sequentially coupled on the lower chamber 510. In addition, a dome 541 may be provided as a ceiling of a reaction space 582 in the lower chamber 510. The lower chamber 510, the lower gas ring 512, the upper gas ring 514, the dome plate 518, and the dome 541 may constitute a chamber housing 580 that defines the reaction space 582.

A susceptor 520 may be provided on a bottom surface of the lower chamber 510, as a locating unit to locate a substrate W. The susceptor 520 may have a cylindrical shape. The susceptor 520 may be made of an inorganic material such as quartz or aluminum nitride (AlN), or a metal such as aluminum.

An electrostatic chuck 521 may be provided on an upper surface of the susceptor 520. The electrostatic chuck 521 may be configured such that an electrode 522 is inserted into an insulating material. The electrode 522 may be connected to a direct current power supply 523 installed outside the lower chamber 510. A coulombic force may be generated on a surface of the susceptor 520 by the direct current power supply 523, thereby electrostatically attracting the substrate W onto the susceptor 520.

A heater/cooler 526 may be provided in the susceptor 520. The heater/cooler 526 may be connected to a temperature controller 527 configured to control a heating/cooling strength thereof. That is, the temperature of the susceptor 520 may be controlled by the temperature controller 527, and thus the substrate W located on the susceptor 520 may be maintained at a desired temperature.

A susceptor guide 528 is provided around the susceptor 520 to guide the susceptor 520. The susceptor guide 528 may be made of, for example, an insulating material such as ceramics, quartz, or the like.

A vertically moving pin may be embedded in the susceptor 520 to support the substrate W downward and vertically move the substrate W. The vertically moving pin may be inserted into and pass through a through-hole formed in the susceptor 520 to protrude from an upper surface of the susceptor 520. In addition, the number of vertically moving pins may be at least three to support the substrate W.

An exhaust space 530 may be formed around the susceptor 520 to annually surround the susceptor 520. An annular baffle plate 531 with a plurality of exhaust holes formed therein may be provided on an upper portion of the exhaust space 530 to uniformly discharge a gas phase material inside the hydrogen plasma chemical vapor deposition apparatus 500. The baffle plate 531 may include a first layer 531a and a second layer 531b.

An exhaust pipe 532 is connected to a bottom portion of the exhaust space 530, which is a bottom surface of the hydrogen plasma chemical vapor deposition apparatus 500. The number of the exhaust pipes 532 may be arbitrarily determined, and may be provided in plural in a circumferential direction. The exhaust pipe 532 may be connected to, for example, an exhaust apparatus 533 including a vacuum pump. The exhaust apparatus 533 may be configured to reduce pressure of an atmosphere in the hydrogen plasma chemical vapor deposition apparatus 500 up to a predetermined vacuum degree.

A radio frequency (RF) antenna device 540 may be provided on the dome 541 of the hydrogen plasma chemical vapor deposition apparatus 500 to supply microwaves for generating plasma. The RF antenna device 540 may include a slot plate 542, a slow-wave plate 543, and a shield lid 544.

The dome 541 may be made of a dielectric material, for example, quartz, $Al_2O_3$, AlN, or the like to allow microwaves to satisfactorily transmit the dome 541. The dome 541 may closely contact the dome plate 518 by using a sealing member such as O-ring or the like.

The slot plate 542 may be located on the dome 541 and arranged to face the susceptor 520. The slot plate 542 may be provided with a plurality of slots and function as an antenna. The slot plate 542 may be made of a conductive material, for example, copper, aluminum, nickel, or the like.

The slow-wave plate 543 is provided on the slot plate 542 and may be configured to shorten the wavelength of a microwave. The slow-wave plate 543 may be made of a low-loss dielectric material, for example, quartz, $Al_2O_3$, AlN, or the like.

The shield lid 544 may be provided on the slow-wave plate 543 to cover the slot plate 542 and the slow-wave plate 543. A plurality of annular flow paths 545 may be installed inside the shield lid 544 to flow, for example, a cooling medium. The dome 541, the slot plate 542, the slow-wave plate 543, and the shield lid 544 may be adjusted at a predetermined temperature by the cooling medium flowing through the flow paths 545.

A coaxial waveguide 550 may be connected to a central portion of the shield lid 544. The coaxial waveguide 550 may include an inner conductor 551 and an outer pipe 552. The inner conductor 551 may be connected to the slot plate 542. A slot plate 542-side of the inner conductor 551 may be conically formed, and may be configured to efficiently transmit microwaves with respect to the slot plate 542.

A mode converter 553 to convert microwaves to a predetermined vibration mode, a rectangular waveguide 554, and a microwave generator 555 to generate microwaves may be sequentially connected to the coaxial waveguide 550. The microwave generator 555 may generate microwaves with a predetermined frequency, for example, 2.45 GHz. A power of about 2,000 W or more may be applied to the microwave generator 555. A power of about 3,000 W to about 3,500 W may also be applied to the microwave generator 555.

In the hydrogen plasma chemical vapor deposition apparatus 500, a plasma-generating method may be of a capacitive type or an inductive type. Also, the hydrogen plasma chemical vapor deposition apparatus 500 may be connected to a remote plasma generator such as a plasma tube.

By such a configuration, microwaves generated by the microwave generator 555 are sequentially transmitted to the rectangular waveguide 554, the mode converter 553, and the coaxial waveguide 550, supplied into the RF antenna device 540, compressed by the slow-wave plate 543 to have a short wavelength, converted into circularly polarized waves by the slot plate 542, and then pass through a microwave transmission plate 541 from the slot plate to be emitted into the reaction space 582. In the reaction space 582, a process gas (e.g., a source material) is converted into plasma by the microwaves, and the substrate W is subjected to plasma treatment by the plasma.

In this case, the RF antenna device 540, the coaxial waveguide 550, the mode converter 553, the rectangular waveguide 554, and the microwave generator 555 may constitute a plasma generator.

A first process gas supply pipe 560 is installed as a first process gas supply unit at a central portion of the RF antenna device 540. The first process gas supply pipe 560 passes through the RF antenna device 540, and an end portion of the first process gas supply pipe 560 passes through a lower surface of the dome 541 to be opened. In addition, the first process gas supply pipe 560 passes through the inside of the inner conductor 551 of the coaxial waveguide 550 and is further inserted into and pass through the mode converter 553 so that another end portion of the first process gas supply pipe 560 may be connected to a first process gas supply source 561. A source material such as tetramethylsilane may be stored as a process gas inside the first process gas supply source 561. However, hydrogen, $N_2$ gas, and/or Ar gas may be further stored individually according to need. In addition, a supply device group 562 including a valve, flow rate adjustment unit, or the like configured to control the flow of a first process gas is installed at the first process gas supply pipe 560.

As illustrated in FIG. 10, a second process gas supply pipe 570 as a second process gas supply unit is installed at a side surface of the chamber housing 580. A plurality of second process gas supply pipes 570, for example, 24 second process gas supply pipes 570, may be installed at a constant interval on a circumference of the side surface of the chamber housing 580. An end portion of the second process gas supply pipe 570 has an opening at the side surface of the chamber housing 580, and another end portion thereof may be connected to a buffer unit 571.

The buffer unit 571 may be annually installed inside the side surface of the chamber housing 580, and may be installed as a single unit at the plurality of second process gas supply pipes 570. A second process gas supply source 573 is connected to the buffer unit 571 via a supply pipe 572. A process gas, for example, $N_2$ gas, $H_2$ gas, Ar gas, or the like may be stored individually in the second process gas supply source 573. In addition, a supply device group 574 including a valve, flow rate adjustment unit, or the like configured to control the flow of a second process gas may be installed at the supply pipe 572. In addition, as illustrated in FIG. 10, the second process gas supplied from the second process gas supply source 573 may be introduced into the buffer unit 571 via the supply pipe 572, and may be supplied into the chamber housing 580 via the second process gas supply pipe 570 after keeping a pressure in a circumferential direction uniform in the buffer unit 571.

While the inventive concept has been particularly shown and described with reference to embodiments thereof, it will be understood that various changes in form and details may be made therein without departing from the spirit and scope of the following claims.

What is claimed is:

1. A method of forming micropatterns, the method comprising:

forming an etching target film on a substrate;

forming a photosensitivity assisting layer on the etching target film, the photosensitivity assisting layer being terminated with a hydrophilic group;

forming an adhesive layer on the photosensitivity assisting layer, the adhesive layer forming a covalent bond with the hydrophilic group;

forming a hydrophobic photoresist film on the adhesive layer; and patterning the photoresist film, wherein the forming of the adhesive layer comprises supplying an aminosilane compound, a monosilane compound having a structure represented by a formula $SiR^1R^2R^3R^4$ and/or a disilane compound having a structure represented by a formula $R^5R^6R^7Si\text{---}SiR^8R^9R^{10}$, wherein each of $R^1$, $R^2$, $R^3$, and $R^4$ is independently hydrogen, $C_1$-$C_5$ alkyl group, a $C_1$-$C_5$ alkoxy group, a $C_2$-$C_5$ alkenyl group, a $C_2$-$C_5$ alkynyl group, or a $C_6$-$C_{10}$ aryl group, and all of $R^1$, $R^2$, $R^3$, and $R^4$ are not hydrogen at the same time such that at least two thereof are the other substituents, and each of $R^5$, $R^6$, $R^7$, $R^8$, $R^9$, and $R^{10}$ is independently hydrogen, a hydroxyl group, a $C_1$-$C_5$ alkyl group, a $C_1$-$C_5$ alkoxy group, a $C_2$-$C_5$ alkenyl group, a $C_2$-$C_5$ alkynyl group, or a $C_6$-$C_{10}$ aryl group, and all of $R^5$, $R^6$, $R^7$, $R^8$, $R^9$, and $R^{10}$ are not hydrogen at the same time such that at least one of $R^5$, $R^6$, and $R^7$ is one of the other substituents and at least one of $R^8$, $R^9$, and $R^{10}$ is one of the other substituents.

2. The method of claim 1, wherein the forming of the adhesive layer is performed by chemical vapor deposition (CVD).

3. The method of claim 2, wherein the CVD is plasma-enhanced CVD (PECVD).

4. The method of of claim 1, wherein the monosilane compound comprises at least one of tetramethylsilane, trimethylsilane, and hexamethyldisilane.

5. The method of claim 4, wherein the patterning of the photoresist film comprises:
exposing the photoresist film to light by using a photomask; and
developing an exposed photoresist film,
wherein exposing the photoresist film is performed using extreme ultraviolet (EUV) light.

6. The method of claim 1, wherein the forming of the adhesive layer is performed at a temperature ranging from about 250° C. to about 450° C.

7. The method of claim 1, wherein the hydrophilic group comprises at least one of a hydroxyl group (—OH), a carboxyl group (—COOH), an amine group (—NH$_2$), a carbonyl group (—CO—), and a thiol group (—SH).

8. The method of claim 7, wherein the hydrophilic group is a hydroxyl group, and, through the forming of the adhesive layer, a hydrogen atom of the hydroxyl group is substituted with a source material for forming the adhesive layer.

9. The method of claim 1, wherein a distance between the photoresist film and the photosensitivity assisting layer is less than 50 Å.

10. The method of claim 9, wherein the adhesive layer has a thickness of about 2 Å to about 25 Å.

11. The method of claim 1, wherein an upper surface of the adhesive layer has hydrophobicity.

12. The method of claim 1, wherein the hydrophobic photoresist film has a thickness of about 20 nm to about 50 nm.

13. The method of claim 1, wherein the photosensitivity assisting layer is a material layer capable of emitting secondary electrons in response to irradiation of EUV light.

14. A method of forming micropatterns, the method comprising:
forming an etching target film on a substrate;
forming a photosensitivity assisting layer on the etching target film;
forming an adhesive layer on the photosensitivity assisting layer;
forming a hydrophobic photoresist film on the adhesive layer; and
patterning the photoresist film,
wherein the forming of the adhesive layer comprises supplying an aminosilane compound, a monosilane compound having a structure represented by a formula $SiR^1R^2R^3R^4$ and/or a disilane compound having a structure represented by a formula $R^5R^6R^7Si$—$SiR^8R^9R^{10}$,
wherein each of $R^1$, $R^2$, $R^3$, is independently hydrogen $C_1$-$C_5$ alkyl group, a $C_1$-$C_5$ alkoxy group, a $C_2$-$C_5$ alkenyl group, a $C_2$-$C_5$ alkynyl group, or a $C_6$-$C_{10}$ aryl group, and all of $R^1$, $R^2$, $R^3$, and $R^4$ are not hydrogen at the same time such that at least two thereof are the other substituents, and
each of $R^5$, $R^6$, $R^7$, $R^8$, $R^9$, and $R^{10}$ is independently hydrogen, a hydroxyl group, a $C_1$-$C_5$ alkyl group, a $C_1$-$C_5$ alkoxy group, a $C_2$-$C_5$ alkenyl group, a $C_2$-$C_5$ alkynyl group, or a $C_6$-$C_{10}$ aryl group, and all of $R^5$, $R^6$, $R^7$, $R^8$, $R^9$, and $R^{10}$ are not hydrogen at the same time such that at least one of $R^5$, $R^6$, and $R^7$ is one of the other substituents and at least one of $R^8$, $R^9$, and $R^{10}$ is one of the other substituents.

15. The method of claim 14, wherein the photosensitivity assisting layer is a material layer capable of emitting secondary electrons in response to light having a wavelength of 13.5 nm.

16. The method of claim 15, wherein the photosensitivity assisting layer comprises one selected from amorphous silicon (a-Si), tin oxide (SnO$_x$), titanium oxide (TiO$_x$), and silicon oxynitride (SiON).

17. The method of claim 16, wherein, immediately before the forming of the adhesive layer, an upper surface of the photosensitivity assisting layer is terminated with a hydrophilic group.

18. The method of claim 17, wherein the adhesive layer forms a covalent bond with the hydrophilic group of the photosensitivity assisting layer.

19. A method of forming micropatterns, the method comprising:
forming an etching target film on a substrate;
forming a photosensitivity assisting layer on the etching target film, the photosensitivity assisting layer being terminated with a hydrophilic group;
forming an adhesive layer on the photosensitivity assisting layer, the adhesive layer forming a covalent bond with the hydrophilic group;
forming a hydrophobic photoresist film on the adhesive layer; and
patterning the photoresist film,
wherein the hydrophilic group is a hydroxyl group, and, through the forming of the adhesive layer, a hydrogen atom of the hydroxyl group is substituted with a source material for forming the adhesive layer.

* * * * *